United States Patent
Le et al.

(10) Patent No.: US 11,189,700 B2
(45) Date of Patent: Nov. 30, 2021

(54) FABRICATION OF WRAP-AROUND AND CONDUCTING METAL OXIDE CONTACTS FOR IGZO NON-PLANAR DEVICES

(71) Applicant: Intel Corporation, Santa Clara, CA (US)

(72) Inventors: Van H. Le, Portland, OR (US); Rafael Rios, Austin, TX (US); Gilbert Dewey, Hillsboro, OR (US); Jack T. Kavalieros, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,549

(22) PCT Filed: Dec. 23, 2015

(86) PCT No.: PCT/US2015/000318
§ 371 (c)(1),
(2) Date: May 3, 2018

(87) PCT Pub. No.: WO2017/111796
PCT Pub. Date: Jun. 29, 2017

(65) Prior Publication Data
US 2018/0323264 A1 Nov. 8, 2018

(51) Int. Cl.
*H01L 29/24* (2006.01)
*H01L 29/66* (2006.01)
(Continued)

(52) U.S. Cl.
CPC .......... *H01L 29/24* (2013.01); *H01L 21/443* (2013.01); *H01L 21/76802* (2013.01);
(Continued)

(58) Field of Classification Search
CPC .............. H01L 29/785; H01L 29/7869; H01L 29/66795; H01L 29/41791
See application file for complete search history.

(56) References Cited

U.S. PATENT DOCUMENTS 9,054,678 B2 *  6/2015  Ohmaru ................. H03K 3/012
2013/0062669 A1  3/2013  Chen et al.
(Continued)

FOREIGN PATENT DOCUMENTS

| CN | 104137228 A | 11/2014 |
| CN | 104979396   | 10/2015 |
| CN | 104126228 B | 12/2016 |

OTHER PUBLICATIONS

International Preliminary Report on Patentablity for International Patent Application No. PCT/US2015/000318, dated Jul. 5, 2018, 12 pages.
(Continued)

*Primary Examiner* — Ermias T Woldegeorgis
(74) *Attorney, Agent, or Firm* — Schwabe, Williamson & Wyatt, P.C.

(57) ABSTRACT

Embodiments of the invention include non-planar InGaZnO (IGZO) transistors and methods of forming such devices. In an embodiment, the IGZO transistor may include a substrate and an IGZO fin formed above the substrate. Embodiments may include a source contact and a drain contact that are formed adjacent to more than one surface of the IGZO fin. Additionally, embodiments may include a gate electrode formed between the source contact and the drain contact. The gate electrode may be separated from the IGZO layer by a gate dielectric. In one embodiment, the IGZO transistor is a finfet transistor. In another embodiment the IGZO transistor is a nanowire or a nanoribbon transistor. Embodiments of the invention may also include a non-planar IGZO transistor
(Continued)

that is formed in the back end of line stack (BEOL) of an integrated circuit chip.

18 Claims, 12 Drawing Sheets

(51) Int. Cl.
    *H01L 29/78*     (2006.01)
    *H01L 29/06*     (2006.01)
    *H01L 29/786*     (2006.01)
    *H01L 29/423*     (2006.01)
    *H01L 27/092*     (2006.01)
    *H01L 29/417*     (2006.01)
    *H01L 29/775*     (2006.01)
    *H01L 21/443*     (2006.01)
    *H01L 21/768*     (2006.01)
    *H01L 29/04*     (2006.01)
    *H01L 29/45*     (2006.01)
    *H01L 21/02*     (2006.01)

(52) U.S. Cl.
    CPC .... *H01L 21/76877* (2013.01); *H01L 27/0924* (2013.01); *H01L 29/04* (2013.01); *H01L 29/0649* (2013.01); *H01L 29/0673* (2013.01); *H01L 29/247* (2013.01); *H01L 29/41733* (2013.01); *H01L 29/41758* (2013.01); *H01L 29/41791* (2013.01); *H01L 29/42392* (2013.01); *H01L 29/45* (2013.01); *H01L 29/66545* (2013.01); *H01L 29/66795* (2013.01); *H01L 29/66969* (2013.01); *H01L 29/775* (2013.01); *H01L 29/785* (2013.01); *H01L 29/78693* (2013.01); *H01L 29/78696* (2013.01); *H01L 21/02554* (2013.01); *H01L 21/02565* (2013.01); *H01L 21/02592* (2013.01); *H01L 21/02617* (2013.01)

(56) References Cited

U.S. PATENT DOCUMENTS

| | | | |
|---|---|---|---|
| 2013/0153997 A1 | 6/2013 | Chang et al. | |
| 2013/0181214 A1* | 7/2013 | Yamazaki | H01L 29/7869 257/43 |
| 2014/0001441 A1* | 1/2014 | Kim | H01L 21/30604 257/29 |
| 2014/0087523 A1 | 3/2014 | Basker et al. | |
| 2014/0159771 A1* | 6/2014 | Ikeda | H03K 19/17772 326/41 |
| 2015/0108470 A1* | 4/2015 | Yamazaki | H01L 29/78696 257/43 |
| 2015/0108475 A1* | 4/2015 | Ando | C23C 14/351 257/43 |
| 2015/0214377 A1* | 7/2015 | Ito | H01L 29/78648 257/43 |
| 2015/0332964 A1* | 11/2015 | Cheng | H01L 21/28568 257/288 |

OTHER PUBLICATIONS

International Search Report and Written Opinion for International Patent Application No. PCT/US2015/000318 dated Sep. 22, 2016, 15 pgs.
Office Action for Taiwan Patent Application No. 105138281, dated Feb. 15, 2020, 9 pgs.
Office Action for Taiwan Patent Application No. 105138281, dated Oct. 15, 2021, 20 pgs.
Office Action for Chinese Patent Application No. 105138281, dated Jan. 25, 2021, 12 pgs.

* cited by examiner

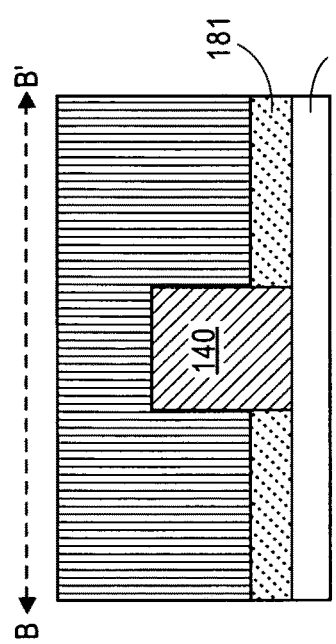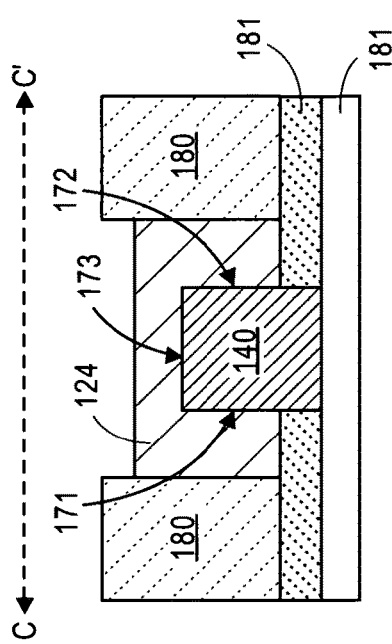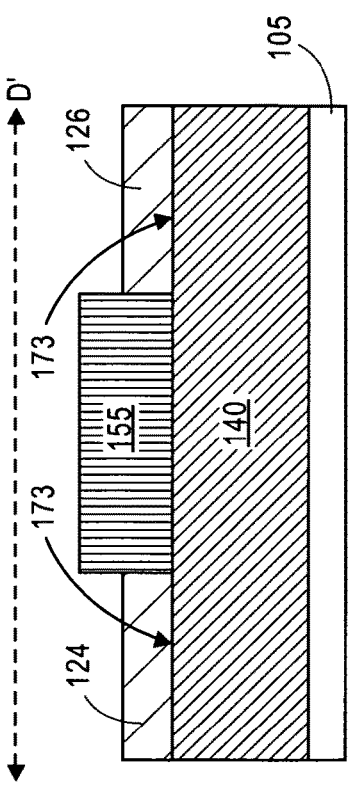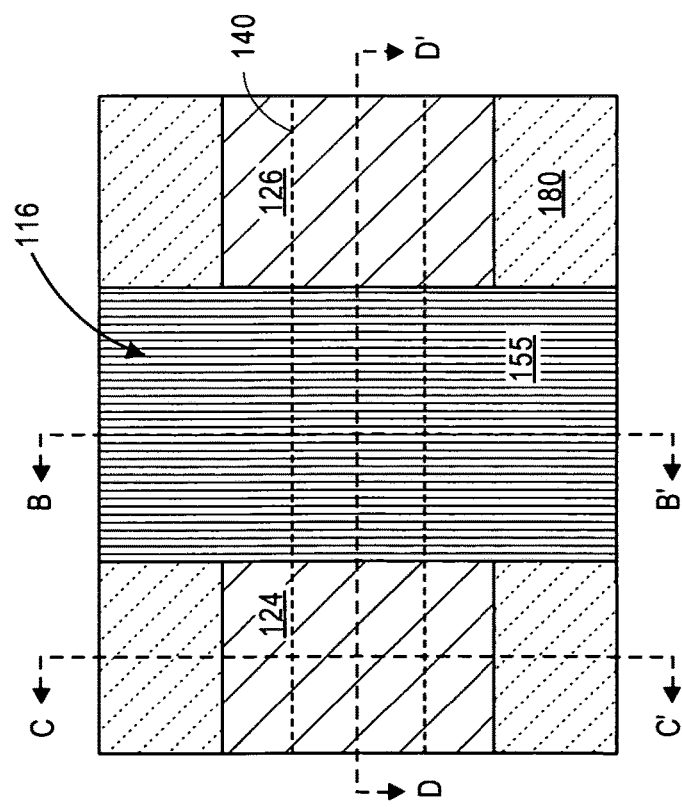
FIG. 3B
FIG. 3C
FIG. 3D
FIG. 3A

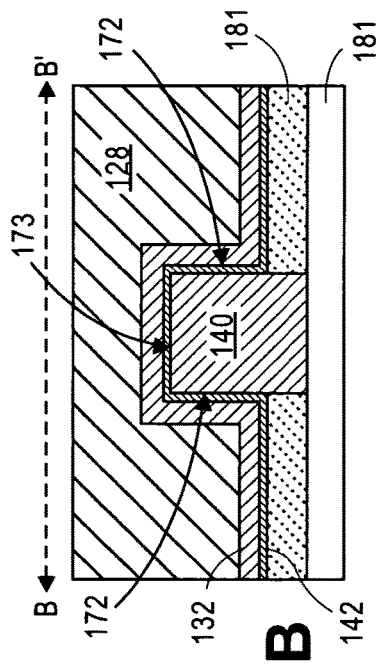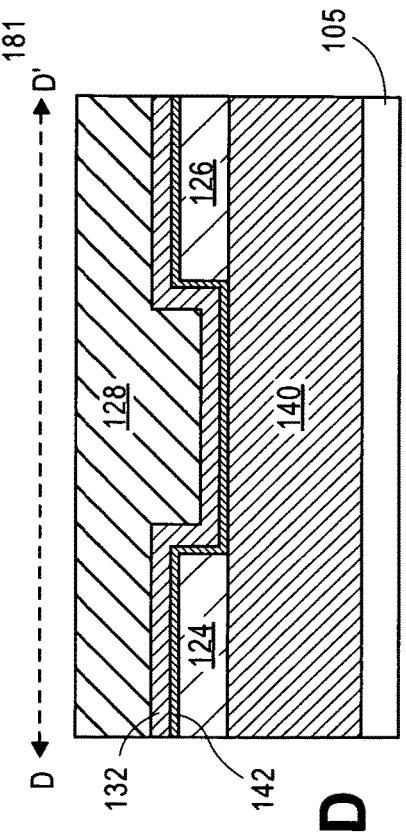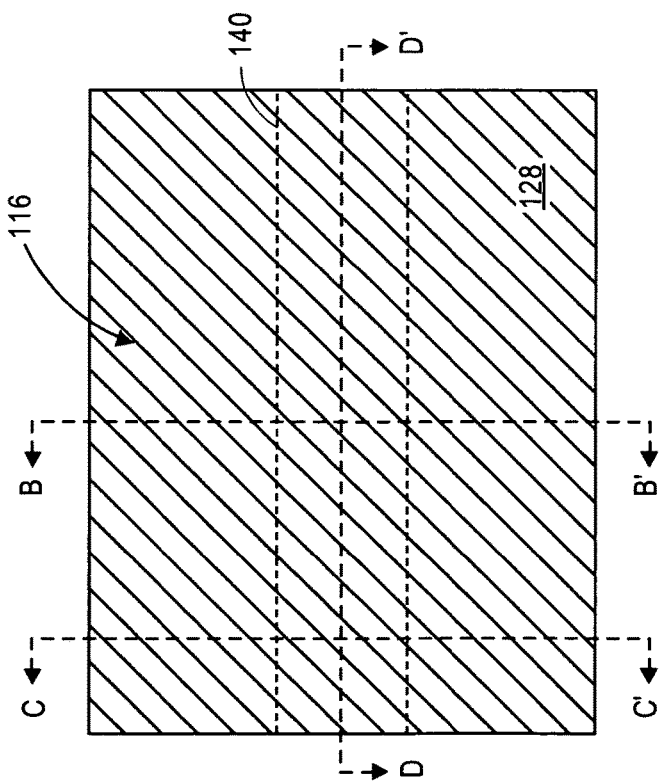

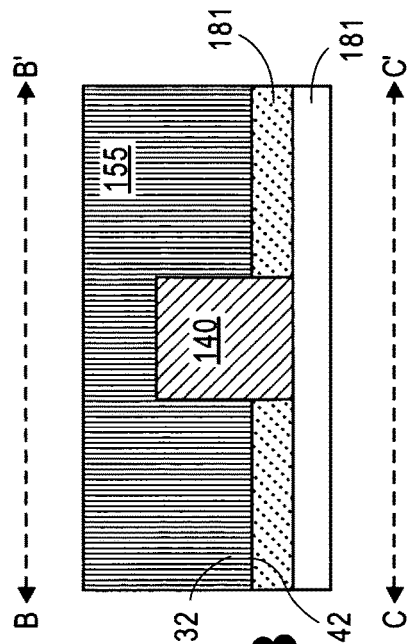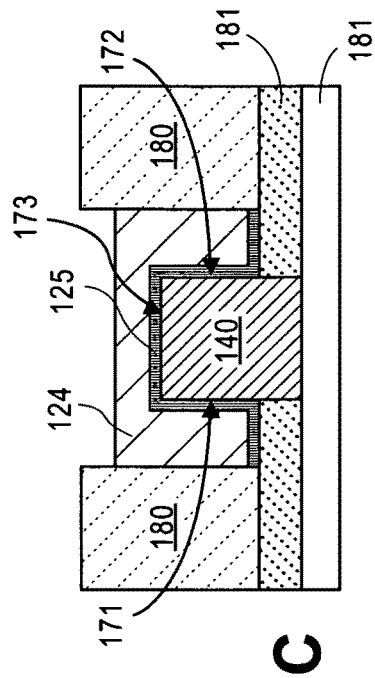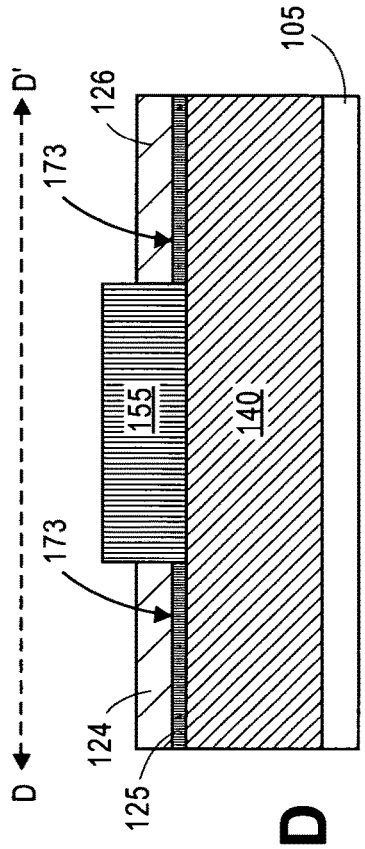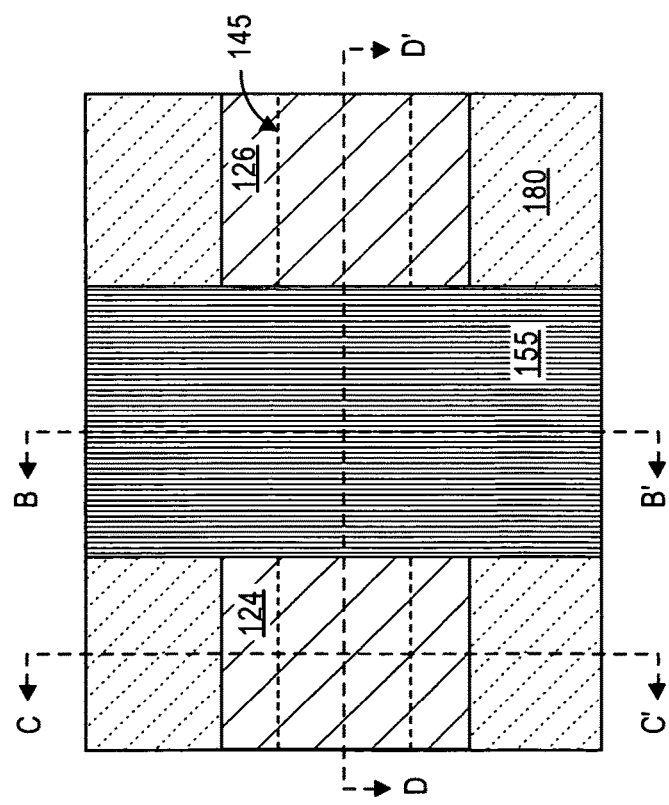

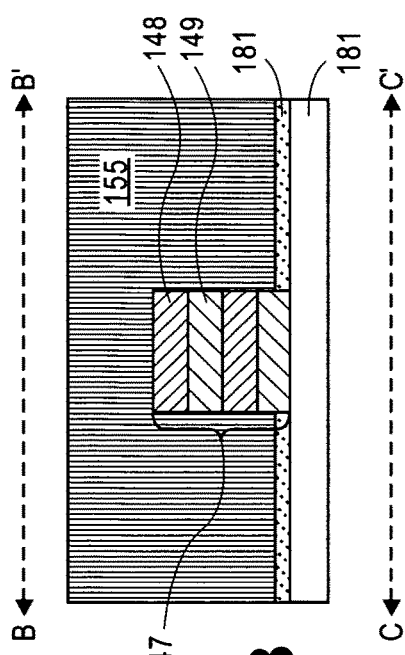
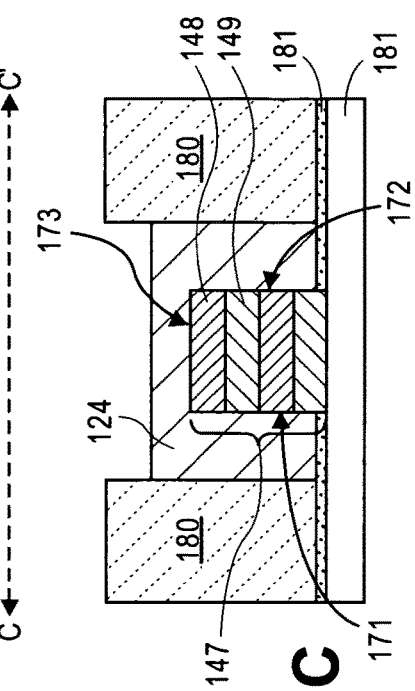
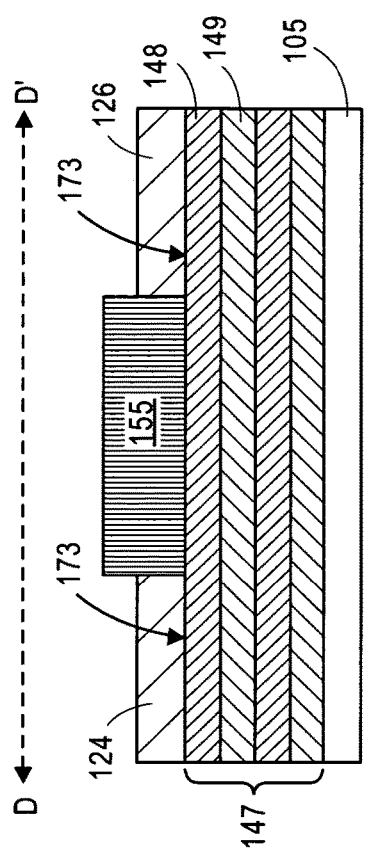
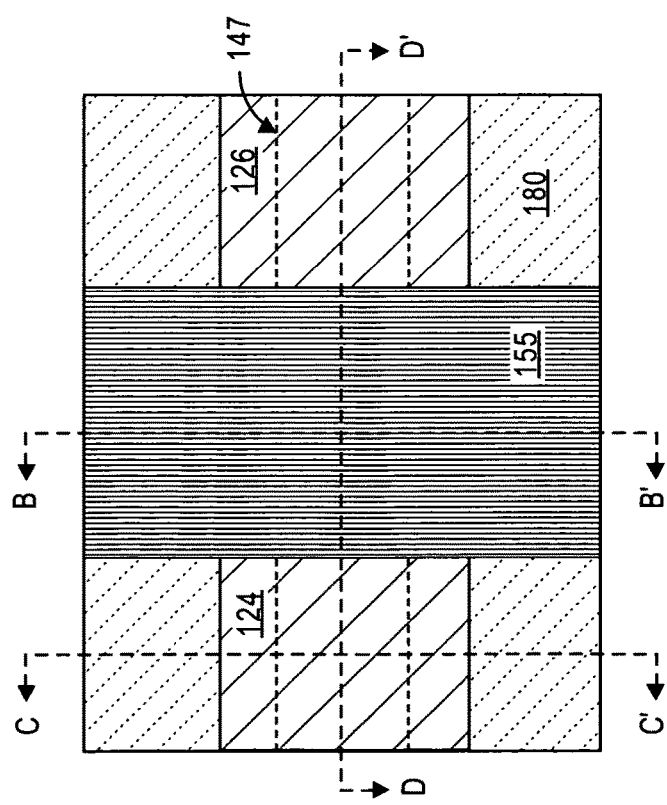
FIG. 8B
FIG. 8C
FIG. 8D
FIG. 8A

FABRICATION OF WRAP-AROUND AND CONDUCTING METAL OXIDE CONTACTS FOR IGZO NON-PLANAR DEVICES

CROSS-REFERENCE TO RELATED APPLICATION

This patent application is a U.S. National Phase Application under 35 U.S.C. § 371 of International Application No. PCT/US2015/000318, filed Dec. 23, 2015, entitled "FABRICATION OF WRAP-AROUND AND CONDUCTING METAL OXIDE CONTACTS FOR IGZO NON-PLANAR DEVICES," which designates the United States of America, the entire disclosure of which is hereby incorporated by reference in its entirety and for all purposes.

FIELD OF THE INVENTION

Embodiments of the invention are in the field of semiconductor devices and processing and, in particular, semiconductor devices that include a non-planar indium-gallium-zinc-oxide (IGZO) transistors, and methods of forming such devices.

BACKGROUND OF THE INVENTION

Recently, there has been an increased use of amorphous InGaZnO (a-IGZO) semiconductors for transistor applications. The increase in use has been driven by several desirable electrical and manufacturing properties of such devices. For example, a-IGZO transistors are typically characterized by high band gaps, high mobility, low-temperature process compatibility, and low fabrication cost. Currently, the dominant use of transistors that include a-IGZO semiconductors is in light emitting diode (LED) and organic LED (OLED) applications. The a-IGZO transistors are typically used in an active matrix display in order to control the pixels of the display. In order to meet the electrical performance specifications needed in the active matrix displays, a-IGZO transistors are fabricated as large planar transistors with large gate lengths.

The use of a-IGZO in display technologies is particularly beneficial because the relative size of the transistors (compared to transistors used in integrated circuit (IC) chips, or the like) is not currently a critical concern. As such, large planar transistors do not typically cause problems when used in an active-matrix display. However, as the pixel sizes continue to decrease, there may be a need to scale down the size of a-IGZO transistors. Additionally, the large size of a-IGZO transistors limits the use of such devices to applications where size is not a major concern. For example, large a-IGZO transistors that are currently available would occupy too much real estate on an IC to be cost effective.

Decreasing the size of a-IGZO transistors degrades the electrical properties as well. For example, as the size decreases, planar a-IGZO transistors increasingly suffer from undesirable short-channel effects, such as, high leakage current. Additionally, scaling down a planar a-IGZO transistor reduces the drive current. Accordingly, scaled down planar a-IGZO transistors suffer from high power consumption and overall reduced device performance.

BRIEF DESCRIPTION OF THE DRAWINGS

FIG. 3A is a plan view illustration of the fin in FIG. 2A after a source and drain contact are deposited and patterned, and a second dielectric layer is formed over the first dielectric layer, according to an embodiment of the invention.

FIG. 3B is a cross-sectional illustration of FIG. 3A along line B-B', according to an embodiment of the invention.

FIG. 3C is a cross-sectional illustration of FIG. 3A along line C-C', according to an embodiment of the invention.

FIG. 3D is a cross-sectional illustration of FIG. 3A along line D-D', according to an embodiment of the invention.

FIG. 5A is a plan view illustration of the fin in FIG. 4A after a gate dielectric, a workfunction metal, and a fill metal have been deposited over the fin, according to an embodiment of the invention.

FIG. 5B is a cross-sectional illustration of FIG. 5A along line B-B', according to an embodiment of the invention.

FIG. 5C is a cross-sectional illustration of FIG. 5A along line C-C', according to an embodiment of the invention.

FIG. 5D is a cross-sectional illustration of FIG. 5A along line D-D', according to an embodiment of the invention.

FIG. 7A is a plan view illustration of the fin in FIG. 2A after an interface layer is deposited over the fin and a source contact and drain contact are deposited over the interface layer, according to an embodiment of the invention.

FIG. 7B is a cross-sectional illustration of FIG. 7A along line B-B', according to an embodiment of the invention.

FIG. 7C is a cross-sectional illustration of FIG. 7A along line C-C', according to an embodiment of the invention.

FIG. 7D is a cross-sectional illustration of FIG. 7A along line D-D', according to an embodiment of the invention.

FIG. 8A is a plan view illustration of a fin that includes alternating layers of a-IGZO and a sacrificial material after a source contact and drain contact are deposited over the fin, according to an embodiment of the invention.

FIG. 8B is a cross-sectional illustration of FIG. 8A along line B-B', according to an embodiment of the invention.

FIG. 8C is a cross-sectional illustration of FIG. 8A along line C-C', according to an embodiment of the invention.

FIG. 8D is a cross-sectional illustration of FIG. 8A along line D-D', according to an embodiment of the invention.

DETAILED DESCRIPTION OF THE INVENTION

Figure 1A:
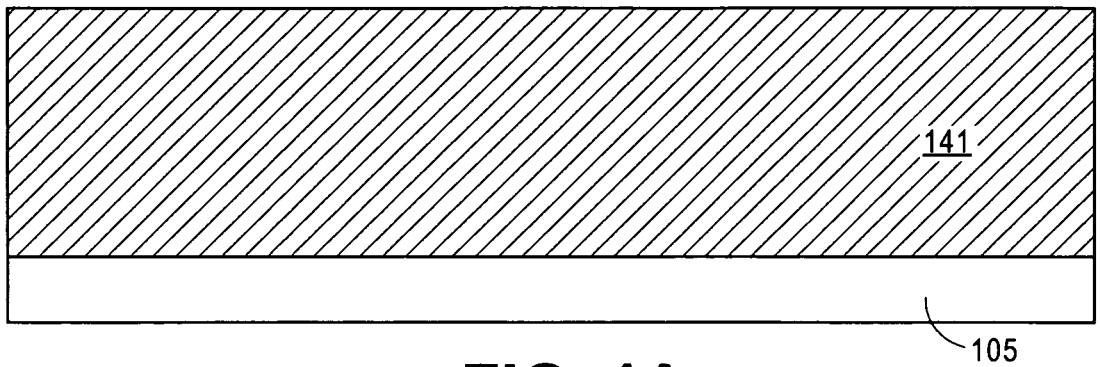
FIG. 1A is a cross-sectional illustration of a substrate with an a-IGZO layer formed over the substrate, according to an embodiment of the invention.

Described herein are systems that include a semiconductor device and methods for forming the semiconductor device that includes non-planar IGZO transistors with wrap-around source and drain contacts. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, a-IGZO materials have electrical characteristics that would make them ideal candidates for applications beyond display technologies. Since a-IGZO transistors can be formed over any desired surface (i.e., a crystalline substrate is not needed for depositing a-IGZO), the non-planar a-IGZO transistors may be integrated into any location in a chip. Additionally, since low temperature processing (e.g., below approximately 400° C.) is used to deposit a-IGZO, embodiments of the invention may include forming the transistors in layers that have low thermal budgets. The combination of being formed on any substrate in addition to being formed with a low temperature process allows for a-IGZO transistors to be integrated into the back end of line (BEOL) stack. Accordingly, a-IGZO materials may be used to form logic applications for high voltage, low leakage back-end transistors. This is particularly beneficial since the real estate in the BEOL stack is not as costly as real estate on the semiconducting layer of the chip.

However, as noted above, scaling down a-IGZO transistors is not without drawbacks. One way to reduce the leakage current and maintain drive current is to fabricate the a-IGZO transistors as non-planar transistors. The increased number of gated surfaces in non-planar transistors provides better electrical control over the channel. Accordingly, scaling problems described above, such as increased leakage current may be avoided while maintaining an acceptable drive current.

Nevertheless, non-planar transistors also produce some problems of their own. For example, in convention non-planar transistor designs, such as finfet, nanowire, or nanoribbon designs, the contact area for the source and drain contacts remains substantially constant as the height of the fin increases. As such, the scaling of the drive current with increasing fin height is negated, at least partially, by increased contact resistance. Furthermore, a-IGZO transistors already have a high contact resistance attributable to a-IGZO's intrinsic wide bandgap and low dopant concentration in the source and drain contacts. Accordingly, embodiments of the invention include non-planar a-IGZO transistors that include wrap-around source and drain contacts in order to maximize the contact area interface between the a-IGZO material and the source/drain contacts. By increasing the interface area there is a higher amount of current spreading possible, and therefore, the total contact resistance of the device may be reduced.

Embodiments of the invention include process flows that may be used to form various non-planar a-IGZO transistors. One such process flow is illustrated and described below with respect to FIGS. 1A-6D.

Referring now to FIG. 1A, a cross-sectional illustration of a device that includes a substrate 105 and an a-IGZO layer 141 formed over the substrate 105 is shown according to an embodiment of the invention. Implementations of the invention may be formed or carried out on a substrate, such as a semiconductor substrate. Additionally, due to the low temperature processing operations described in greater detail below, embodiments of the invention include using any substrate material. In one embodiment, the substrate 105 may be an interlayer dielectric (ILD) in a BEOL stack. For example, ILD substrates may be formed using dielectric materials known for their applicability in integrated circuit structures, such as low-k dielectric materials. Examples of dielectric materials that may be used for the substrate 105 include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. Additional embodiments may include a substrate 105 that is a glass substrate or any other rigid substrate typically used in display technologies. Embodiments of the invention may also include polymeric substrates 105. A polymeric substrate 105 may be a rigid or a flexible material. Forming the a-IGZO transistor on a flexible substrate 105 provides even greater freedom in design and may allow for inclusion of the a-IGZO transistors on wearable devices that are conformable to the user (e.g., watches, biomedical sensors, or the like). In one implementation, the substrate 105 may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate 105 may be formed are described here, any material that may serve as a foundation upon which a semiconductor device may be built falls within the spirit and scope of the present invention.

The a-IGZO layer 141 may be any desired thickness. For example, the thickness chosen for the a-IGZO layer 141 may be dependent on how tall the subsequently formed fins need to be in order to provide the desired electrical properties. In an embodiment, the a-IGZO layer 140 may be deposited with a low temperature process. For example, the a-IGZO layer 140 may be deposited with a process that does not exceed approximately 400° C. In an embodiment, the a-IGZO layer 140 may be deposited with a physical vapor (PVD) deposition process (e.g., sputtering), a chemical vapor deposition (CVD) process, or atomic layer deposition (ALD).

According to an embodiment of the invention, the dielectric layer 106 may be the same material as the substrate 105. Additional embodiments may include using a dielectric layer that is a different material than the substrate 105. In some embodiments of the invention, an etchstop layer (not shown) may be formed between the substrate 105 and the dielectric layer 106.

Figure 1B:
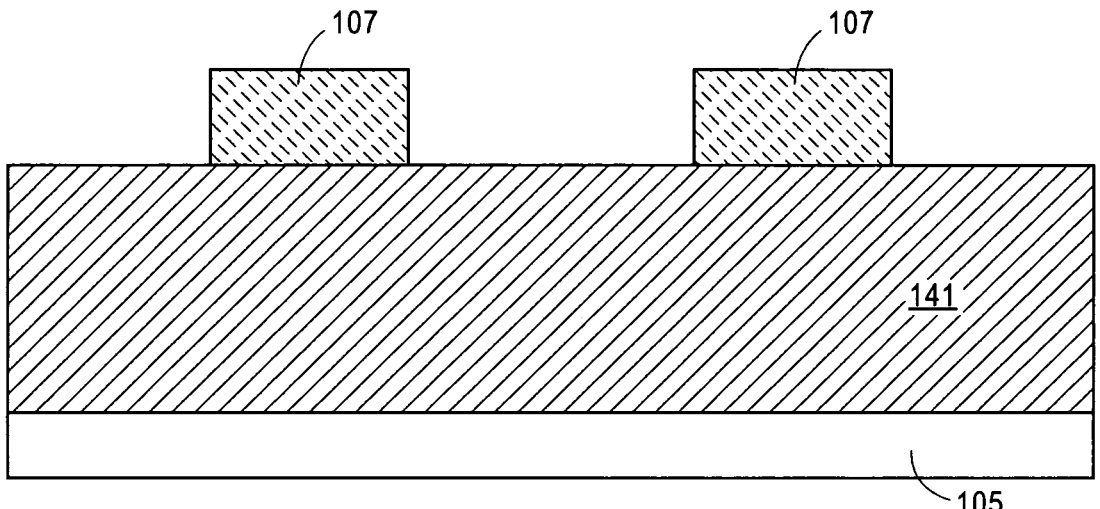
FIG. 1B is a cross-sectional illustration of the substrate in FIG. 1A after a mask layer is deposited over the a-IGZO layer and patterned, according to an embodiment of the invention.

Referring now to FIG. 1B, a cross-sectional illustration of the device after a patterned hardmask layer 107 is formed over the a-IGZO layer 141 is shown according to an embodiment of the invention. According to an embodiment, the patterned hardmask 107 may be formed over the a-IGZO layer 141 portions where a fin is desired to be formed.

Figure 1C:
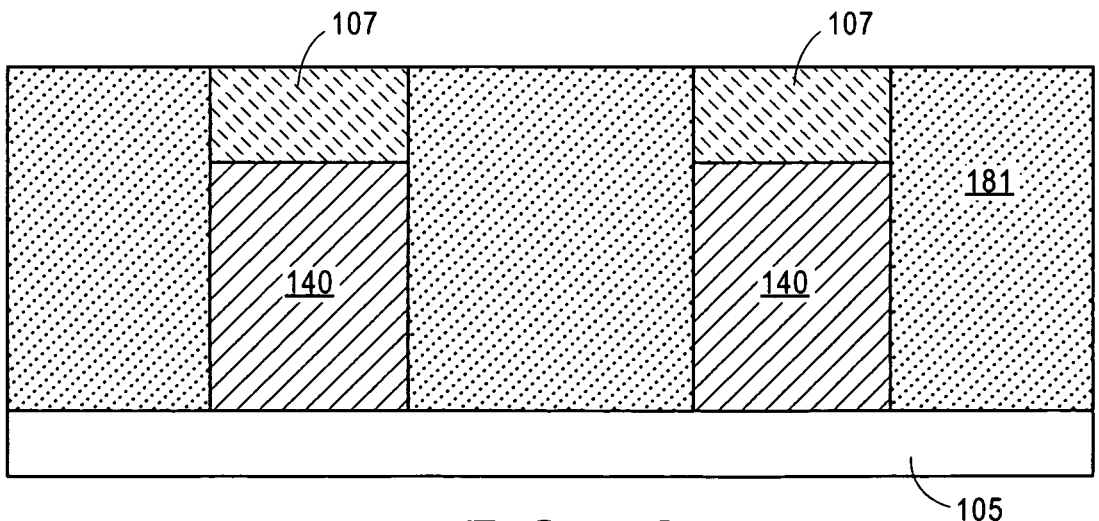
FIG. 1C is a cross-sectional illustration of the substrate in FIG. 1B after the mask layer is used to etch a-IGZO fins and a first dielectric is formed between neighboring fins, according to an embodiment of the invention.

Referring now to FIG. 1C, a cross-sectional illustration of the device after the a-IGZO layer 141 is patterned to form a-IGZO fins 140 is shown according to an embodiment of the invention. In an embodiment, the hardmask layer 107 may mask portions of the a-IGZO layer 141 from being etched during an etching process. For example, the fins 140 may be formed with an anisotropic etch, such as a plasma dry-etching process. According to an embodiment, a first dielectric layer 181 may be deposited between the fins 140. For example, the dielectric layer 181 may be a shallow trench isolation (STI).

Figure 2B:
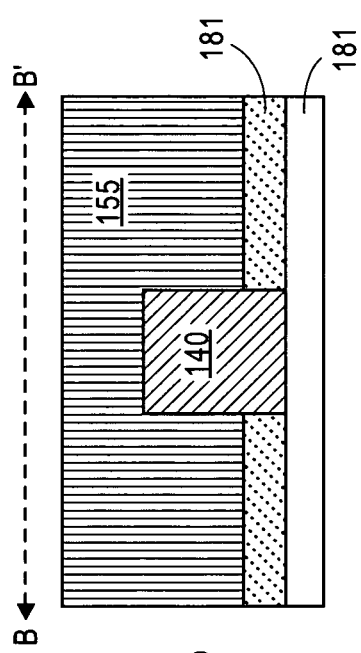
FIG. 2B is a cross-sectional illustration of FIG. 2A along line B-B', according to an embodiment of the invention.
Figure 2C:
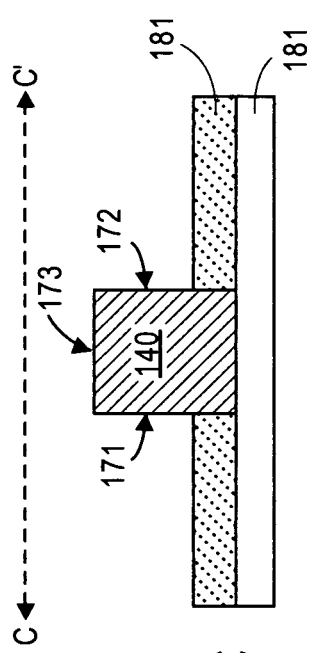
FIG. 2C is a cross-sectional illustration of FIG. 2A along line C-C', according to an embodiment of the invention.
Figure 2D:
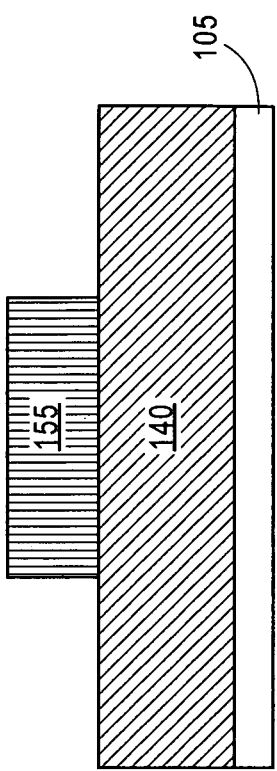
FIG. 2D is a cross-sectional illustration of FIG. 2A along line D-D', according to an embodiment of the invention.
Figure 2A:
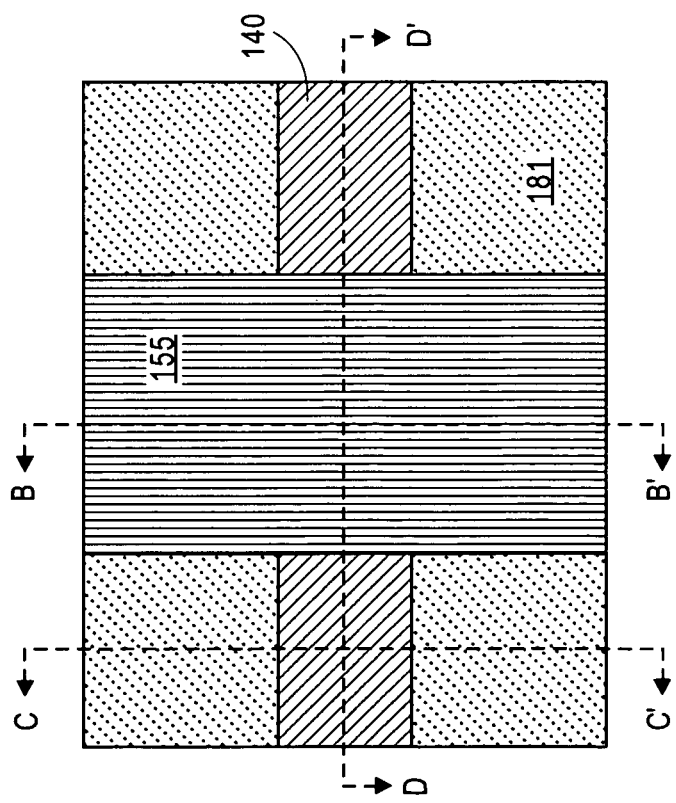
FIG. 2A is a plan view illustration of one of the fins in FIG. 1C after the oxide has been recessed and a dummy gate electrode is formed over the fin, according to an embodiment of the invention.
Figure 4B:
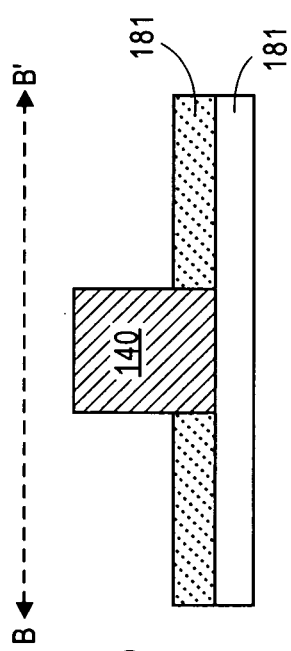
FIG. 4B is a cross-sectional illustration of FIG. 4A along line B-B', according to an embodiment of the invention.
Figure 4C:
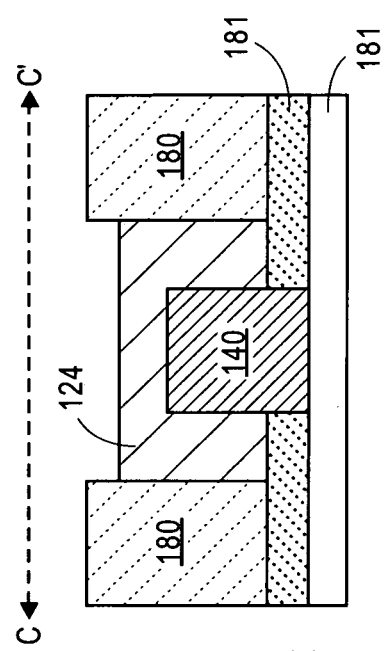
FIG. 4C is a cross-sectional illustration of FIG. 4A along line C-C', according to an embodiment of the invention.
Figure 4D:
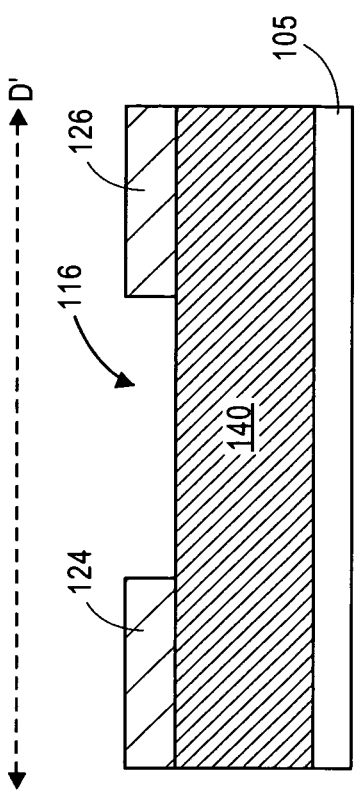
FIG. 4D is a cross-sectional illustration of FIG. 4A along line D-D', according to an embodiment of the invention.
Figure 4A:
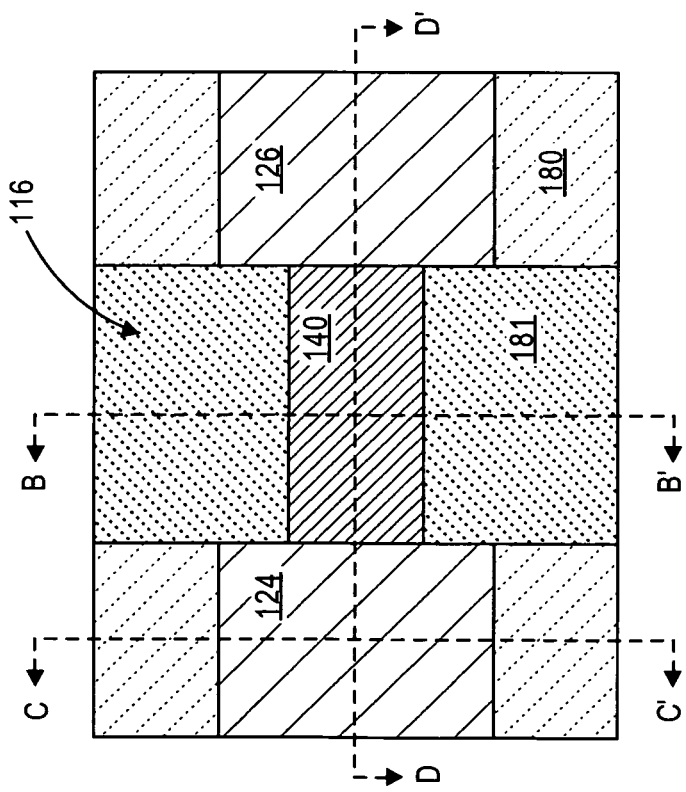
FIG. 4A is a plan view illustration of the fin in FIG. 3A after the dummy gate electrode is removed, according to an embodiment of the invention.
Figure 6B:
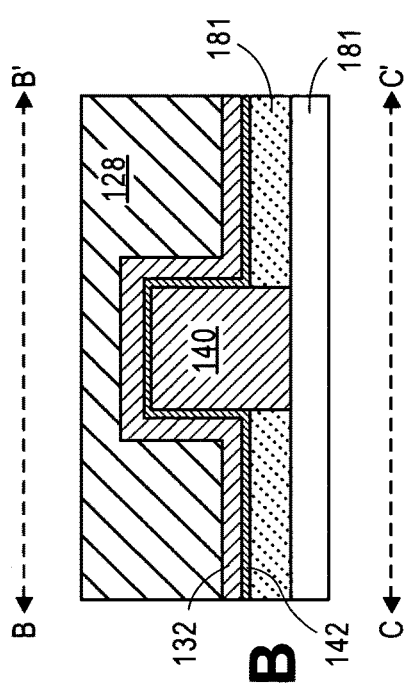
FIG. 6B is a cross-sectional illustration of FIG. 6A along line B-B', according to an embodiment of the invention.
Figure 6C:
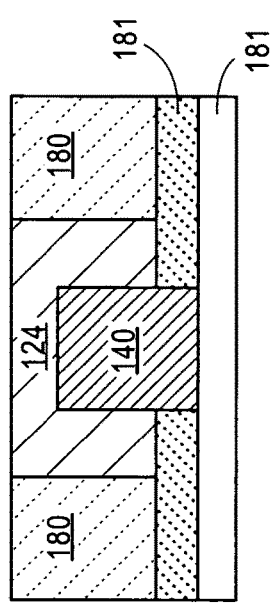
FIG. 6C is a cross-sectional illustration of FIG. 6A along line C-C', according to an embodiment of the invention.
Figure 6D:
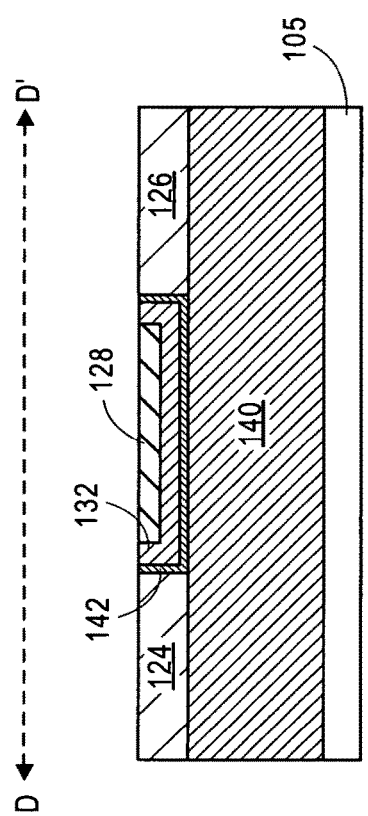
FIG. 6D is a cross-sectional illustration of FIG. 6A along line D-D', according to an embodiment of the invention.
Figure 6A:
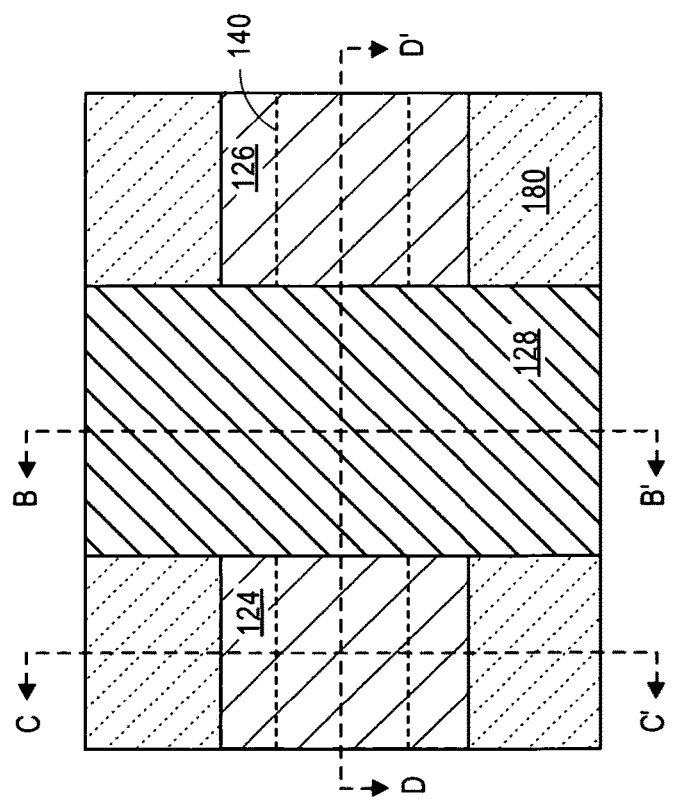
FIG. 6A is a plan view illustration of the fin in FIG. 5A after the fill metal, the workfunction metal, and the gate dielectric have been recessed, according to an embodiment of the invention.

Referring now to FIG. 2A-2D, a plan view illustration and corresponding cross-sectional illustrations along lines B-B', C-C', and D-D' show the device according to an embodiment of the invention after the hard mask is removed, the dielectric layer 181 is recessed, and a dummy gate electrode 155 is formed over the fin 140. According to an embodiment, the dielectric layer 181 may be recessed with any suitable etching process, such as a wet etching process. The amount that the dielectric layer 181 is recessed will define the portion of the fin 140 that will be controlled by the gate. After the dielectric layer 181 is recessed, the dummy gate electrode 155 may be formed over the fin 140. As illustrated in FIG. 2B, the dummy gate electrode contacts the sidewalls and the top surface of the fin 140. In an embodiment, the dummy gate electrode may be formed with a blanket deposition process, and then defined with an etching process, as is known in the art. In an embodiment, the dummy gate electrode 155 may be any material that is etch selective to the a-IGZO fin 140. According to an embodiment, after the dummy gate electrode 155 is formed, sidewall surfaces 171, 172 and a top surface 173 of a portion of the fin 140 are exposed.

Referring now to FIGS. 3A-3D, a plan view illustration and corresponding cross-sectional illustrations along lines B-B', C-C', and D-D' show the device according to an embodiment of the invention after a source contact 124 and a drain contact 126 are formed over portions of the fin 140. According to an embodiment of the invention, the source contact 124 and the drain contact 126 contact multiple surfaces of the fin 140. For example, FIG. 3C illustrates the source contact 124 being in direct contact with sidewalls 171 and 172 of the fin 140 in addition to the top surface 173 of the fin 140. Though no cross-sectional view is, provided for the drain contact 126, it is to be appreciated that the drain contact 126 may also be in direct contact with the sidewalls 171 and 172 in addition to top surface 173 (as shown in FIG. 3D). Forming source and drain contacts 124/126 along multiple surfaces of the fin 140 allows for the contact resistance to be decreased since the interface area between the two layers is increased. Increasing the interface area between the two materials allows for a greater degree of current spreading. Furthermore, it is to be appreciated that as the height of the fin increases, so does the surface area of the interface between the source and drain contacts 124/126 and the fin 140. As such, the problems with scaling that are encountered with conventional contacts, as described above, are avoided according to embodiments of the invention.

In addition to the increased surface area of the interface between the source and drain contacts 124/126 and the fin 140, embodiments of the invention may utilize different materials or material treatments that may also reduce the contact resistance of the device. According to an embodiment, the contacts 124/126 may be a metallic material or a conductive oxide. In one embodiment, when the substrate 105 is a layer in a BEOL stack, the source contact 124 and the drain contact 126 may be the same conductive material used to form interconnect lines and vias (not shown) in the BEOL stack. By way of example, the conductive material may be copper, tungsten, aluminum, titanium, or any alloys thereof. Additional embodiments may include conductive oxides, such as indium-tin-oxide (ITO) or indium-zinc-oxide (IZO).

In addition to material selection, the contact resistance may further be reduced through one or more material treatments. For example, a cleaner surface will typically produce a lower contact resistance compared to a dirtier surface. As such, any cleaning process may be used to clean the surface of the fin 140 prior to forming the source contact 124 and the drain contact 126. For example, the cleaning process may include typical cleaning processes used in semiconductor processing, such as wet cleans or plasma cleans. Additionally, embodiments of the invention may improve the contact resistance of the fin 140 by doping the fin 140 with dopants (e.g., with ion implantation) that decrease contact resistance.

According to an embodiment The source contact 124 and the drain contact 126 may be formed by blanket deposition of the conductive material followed by a patterning operation. For example, the conductive material for the contacts 124/126 may be deposited with any suitable process, such as PVD, CVD, ALD, or the like. In an embodiment, a maximum process temperature may be maintained below approximately 400° C. As such, the processing used to form the contacts 124/26 may be used in temperature sensitive layers of a semiconductor device, such as the BEOL stack. After the conductive material is deposited, the source contact 124 and the drain contact 126 may be patterned with any suitable process, such as a lithographic patterning process. According to an embodiment, after the source contact 124 and drain contact 126 are formed, embodiments of the invention may include forming a second dielectric layer 180 over the exposed portions of first dielectric layer 181.

Alternative embodiments may include forming the second dielectric layer 181 prior to forming the source contact 124 and the drain contact 126. In such embodiments, the second dielectric layer 181 may be blanket deposited and then polished back to have a top surface that is substantially coplanar with a top surface of the dummy electrode 155. Thereafter, a contact opening may be formed through the second dielectric layer 180 to expose the fin 140. According to an embodiment the contact opening has a width that is wider than the fin in order to allow for conductive material to contact the sidewalls 171 and 172 of the fin 140.

In the illustrated embodiment, a top surface of the source contact 124 is shown to be formed below a top surface of the second dielectric layer 180. However, embodiments of the invention are not limited to such configurations. For example, the source contact 124 may have a top surface that is substantially coplanar with a top surface of the second dielectric layer 180. In such an embodiment, the top surfaces of the source contact 124, the drain contact 126, the second dielectric layer 180, and a top surface of the dummy gate electrode may all be substantially coplanar with each other. For example, such a device may be formed when the conductive material used to form the source and drain contacts 124/126 is deposited into openings formed through the second dielectric layer 180. Any conductive material overburden may then be polished back so that all of the surfaces are substantially coplanar.

Jumping ahead in the order of Figures to FIGS. 7A-10D, additional embodiments of the invention that may be used to form source and drain contacts will be illustrated and described before returning to the process flow for forming a non-planar a-IGZO transistor.

Referring now to FIGS. 7A-7D, a plan view illustration and corresponding cross-sectional illustrations along lines B-B', C-C', and D-D' show the device according to an embodiment of the invention after a source contact 124 and a drain contact 126 are formed over portions of the fin 140. The device illustrated in FIGS. 7A-7D is substantially similar to the device illustrated in FIGS. 3A-3D, with the exception that the source contact 124 and the drain contact 126 are separated from the surfaces of the fin 140 by a interface layer 125. According to an embodiment, an interface layer 125 may be deposited over the fin 140 prior to forming the source contact 124 and the drain contact 126. The deposition process may result in the interface layer 125 being formed over other surface of the device as well. For example, the interface layer may be formed in contact with the first dielectric layer 181. Additionally (though not shown), the interface layer may also be formed along the sidewalls of the second dielectric layer 180 when the second dielectric layer is formed prior to the formation of the source and drain contacts 124/126, as described above.

According to an embodiment of the invention, the interface layer 125 may reduce the contact resistance of the device by providing a highly conformal interface between the fin 140 and the contacts 124/126. For example, when the surface of the fin 140 is not atomically smooth, topography along the surface may prevent a continuous contact (at the atomic level) between the materials. For example, the sidewalls 171 and 172 may have increased surface roughness due to the etching process used to form the a-IGZO fin 140 from the a-IGZO layer 140. As such, a highly conformal interface layer 125 may function to smooth out any topography and provide an improved interface between the surfaces of the fin 140 and the source contact 124 and the drain contact 126.

In an embodiment, a highly conformal interface layer 125 may be deposited using an ALD process. An ALD processes may provide layers that have thicknesses of less than 10 nm, and provides the ability to conform to surface roughness on the fin 140. By way of example, the interface layer 125 may be any conducting material that may be conformally deposited, such as a conformal conductive oxide material, semiconductor material, or metallic material.

In addition to improving the mechanical contact between the materials, an interface layer 125 may also be used to increase the conductivity of the surface. For example, conductive oxides, such as IZO or ITO may function as a grading that increases the concentration of indium or zinc at the surface. Higher concentrations of IZO or ITO may also have a smaller band-gap, which will decrease the contact resistance. According to an embodiment, an interface layer 125 may also be a metal used for depinning and may form an ohmic contact. After the interface layer 125 is formed, the source contact 124 and the drain contact 126 may be deposited using any suitable deposition process, such as those described above. The processing operations used to form the non-planar a-IGZO transistor may then proceed with the processing described below with respect to FIGS. 4A-6D.

Referring now to FIGS. 8A-8D, a plan view illustration and corresponding cross-sectional illustrations along lines B-B', C-C', and D-D' show the device according to an embodiment of the invention after a source contact 124 and a drain contact 126 are formed over portions of the fin 140. The device illustrated in FIGS. 8A-8D is substantially similar to the device illustrated in FIGS. 3A-3D, with the exception that the a-IGZO fin 140 of FIG. 3A is replaced by a fin stack 147. According to an embodiment, a fin stack 147 may include one or more alternating layers of a-IGZO layers 148 and sacrificial layers 149. Such an embodiment may be useful for forming nanowire or nanoribbon devices. For example, the fin stack 147 may be processed in substantially the same manner as will be described below with respect to FIGS. 4A-6D, with the addition of an etching process that selectively removes the sacrificial layers 149 from the portion of the fin stack 147 below the dummy electrode 155. As such, the gate dielectric, gate workfunction metal, and (if the spacing between the a-IGZO layers 148 is large enough) the gate electrode, may be formed completely around all surfaces of the a-IGZO layers 148 to form nanowire or nanoribbon transistors.

Figure 8E:
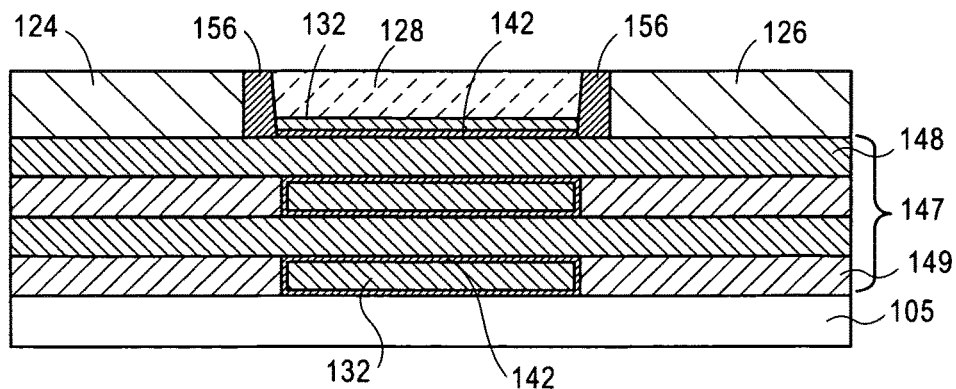
FIG. 8E is a cross-sectional illustration along the fin direction of an a-IGZO nanowire transistor with spacers, according to an embodiment of the invention.

Referring now to FIG. 8E, a cross-sectional illustration of an a-IGZO nanowire device is shown according to an embodiment of the invention. In the illustrated embodiment, a fin stack 147, similar to the fin stack 147 in FIGS. 8A-8D is shown after a portion of the sacrificial layers 149 in the channel region have been removed, and a gate electrode/workfunction metal 128/132 is deposited around the surfaces of the a-IGZO nanowires 148. Additionally, the embodiment illustrated in FIG. 8E includes spacers 156 formed adjacent to the gate electrode 128. According to an embodiment, the source contact 124 and the drain contact 126 may be a wrap-around contact similar to the ones described above in FIGS. 8A-8D. While the wrap-around configuration provides reduced contact resistance relative to contacts that only contact the top surface, embodiments of the invention may decrease the contact resistance to an even greater extent by forming wrap around contacts that completely surround the a-IGZO nanowires 148 in the source and drain regions.

Figure 8F:
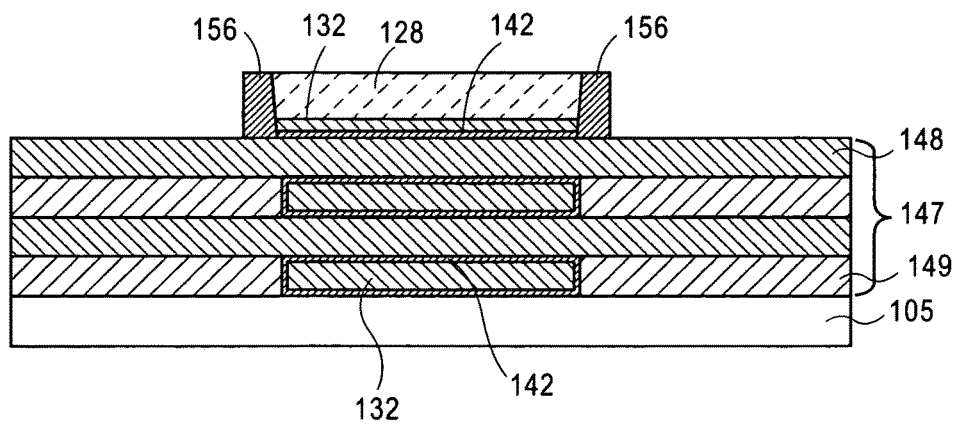
FIG. 8F is a cross-sectional illustration of FIG. 8E after the source contact and the drain contact are removed, according to an embodiment of the invention.

Referring now to FIG. 8F, a cross-sectional illustration of the a-IGZO nanowire device after the source contact 124 and the drain contact 126 are removed is shown according to an embodiment of the invention. For example, the source contact 124 and the drain contact 126 may be removed with an etching process that is selective to the materials used for the contacts.

Figure 8G:
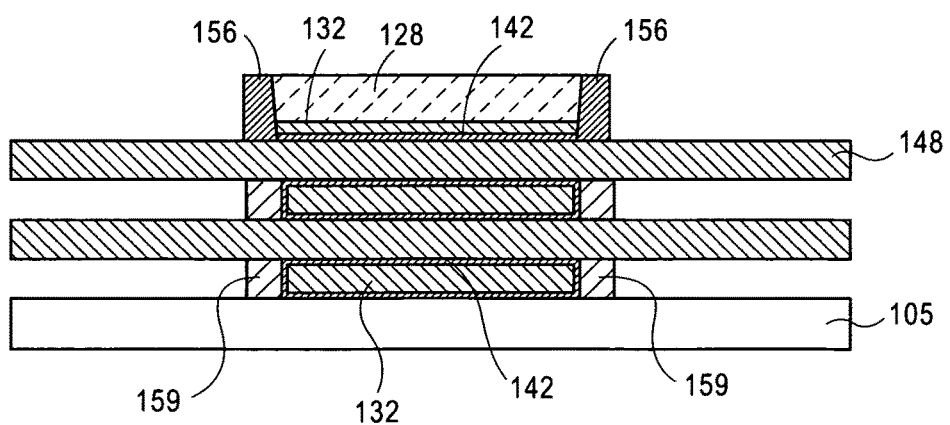
FIG. 8G is a cross-sectional illustration of FIG. 8F after the sacrificial layers have been removed in the source and drain region, according to an embodiment of the invention.

Referring now to FIG. 8G, a cross-sectional illustration of the a-IGZO nanowire device after the sacrificial layers 149 are removed is shown according to an embodiment of the invention. For example, a wet etch that selectively removes the sacrificial layers 149 while leaving the a-IGZO layer 148 substantially unaltered may be used. By way of example, an $H_2O_2$ mixture in water can be used to etch away the sacrificial layer 149 (e.g., a-Ge) selectively over the a-IGZO layers 148. Accordingly, the complete surface of the a-IGZO layers 148 in the source and drain regions may be exposed. It is to be appreciated that the spacers 156 provide a mask that prevents the entire sacrificial layer from being etched away. For example residual spacers 159 from the sacrificial layer may remain behind. The presence of the residual spacers 159 prevents the gate electrode 128 from being shorted by the subsequently formed replacement gate source and drain contacts. Accordingly, a thicker spacer 156 may provide for a more robust device and provide a higher yield. For example, a wet etch may not by anisotropic, and portions of the residual spacers 159 below the spacer 156 may be etched as well.

Figure 8H:
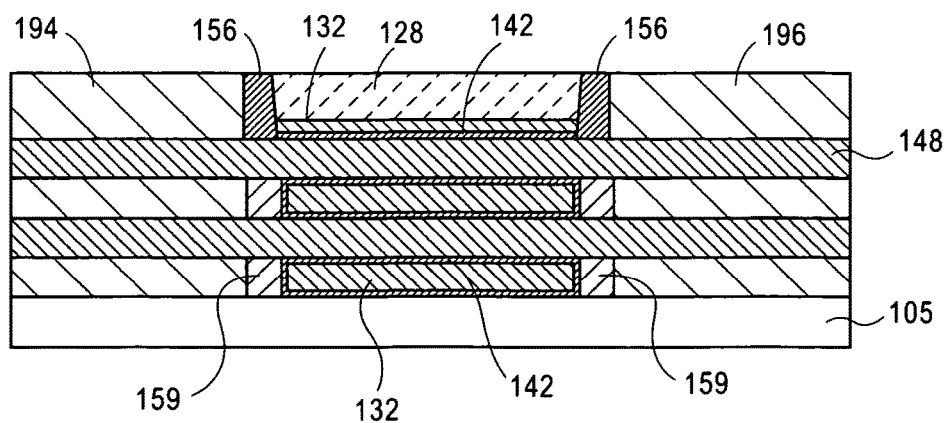
FIG. 8H is a cross-sectional illustration of FIG. 8G after replacement source and drain contacts are formed around the surfaces of the a-IGZO layers in the source and drain regions, according to an embodiment of the invention.

Referring now to FIG. 8H, a cross-sectional illustration of the a-IGZO nanowire device after a replacement source contact 194 and a replacement drain contact 196 are formed around the surfaces of the a-IGZO layers 148. According to an embodiment, the replacement source contact 194 and replacement drain contact 196 may be any suitable conductive material, such as a conductive oxide similar to those described above. In an embodiment the replacement source and drain contacts 194/196 may include an interface layer formed in direct contact with the a-IGZO layer 148 and a fill metal filled around the interface layer, similar to the embodiments described above.

In some of the embodiments illustrated above, the dummy gate electrode 155 does not include sidewall spacers, however embodiments are not limited to such configurations. For example, the sidewall spacers may optionally be formed with any suitable material or process. The use of sidewall spacers on the dummy gate electrode 155 is described in greater detail with respect to FIGS. 9A-9D.

Figure 9B:
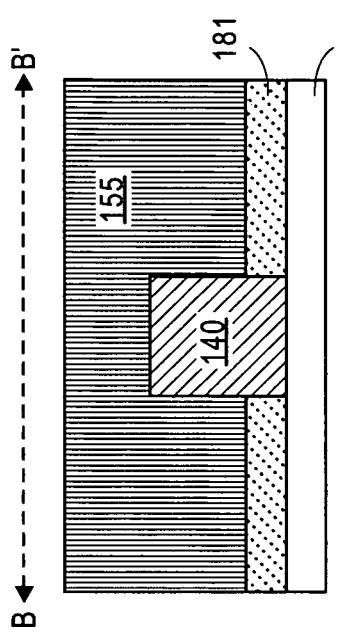
FIG. 9B is a cross-sectional illustration of FIG. 9A along line B-B', according to an embodiment of the invention.
Figure 9C:
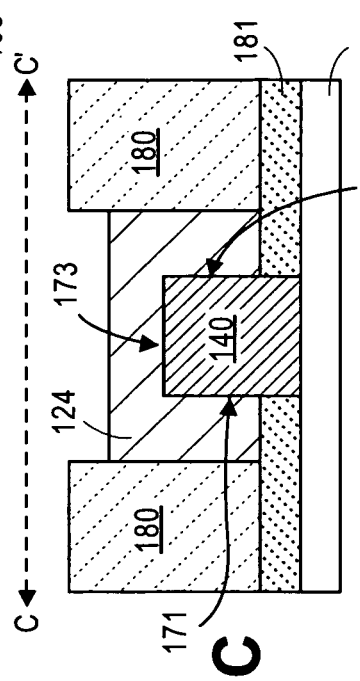
FIG. 9C is a cross-sectional illustration of FIG. 9A along line C-C', according to an embodiment of the invention.
Figure 9D:
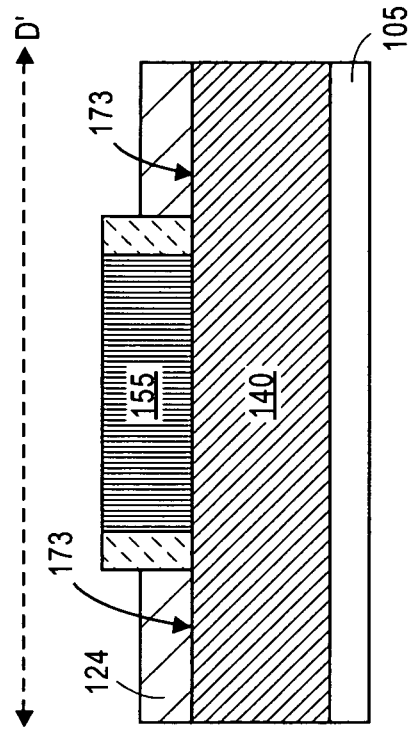
FIG. 9D is a cross-sectional illustration of FIG. 9A along line D-D', according to an embodiment of the invention.
Figure 9A:
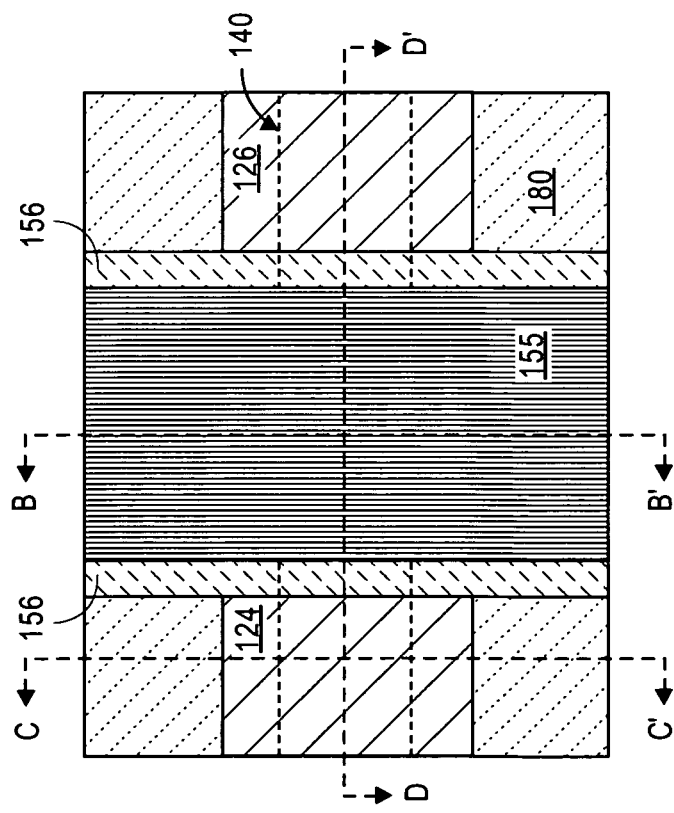
FIG. 9A is a plan view illustration of a fin similar to the one illustrated in FIG. 2A with the addition of spacers formed adjacent to the dummy gate electrode after a source contact and drain contact are deposited over the fin, according to an embodiment of the invention.

Referring now to FIGS. 9A-9D, a plan view illustration and corresponding cross-sectional illustrations along lines B-B', C-C', and D-D' show the device according to an embodiment of the invention after a source contact 124 and a drain contact 126 are formed over portions of the fin 140. The device illustrated in FIGS. 9A-9D is substantially similar to the device illustrated in FIGS. 3A-3D with the exception that spacers 156 are formed along the sidewalls of the dummy electrode 155. As illustrated in FIG. 9D, the spacers 155 prevent the source contact 124 and the drain contact 126 from directly contacting the sidewalls of the dummy electrode 155. Embodiments of the invention may utilize spacers 155 when the subsequently formed gate dielectric layer is not thick enough to provide electrical isolation between the source/drain contacts 124/126 and the gate electrode. As such, the spacers 156 provide an additional electrical buffer between conductive components of the transistor.

According to an embodiment, the sidewall spacers 156 may be formed from a material such as silicon nitride, silicon oxide, silicon carbide, silicon nitride doped with carbon, and silicon oxynitride. Processes for forming sidewall spacers 156 are well known in the art and generally include deposition and etching process steps. In an alternate implementation, a plurality of spacer pairs may be used, for instance, two pairs, three pairs, or four pairs of sidewall spacers 156 may be formed on opposing sides of the gate stack. After the source contact 124 and drain contact 126 are formed adjacent to the spacers 156 the processing operations used to form the non-planar a-IGZO transistor may then proceed with the processing described below with respect to FIGS. 4A-6D.

Returning now to the main process flow, FIGS. 4A-4D provide a plan view illustration and corresponding cross-sectional illustrations of the device along lines B-B', C-C', and D-D' after the dummy gate electrode 155 is removed, according to an embodiment of the invention. It is to be appreciated that the device illustrated here is a device formed substantially similar to the device shown in FIGS. 3A-3D. However, it is to be appreciated, that the following process operations may be used to form non-planar a-IGZO transistors from any of the devices illustrated and described with respect to FIGS. 7A-9D.

In an embodiment, the dummy gate electrode 155 may be removed with an etching process that selectively removes the dummy gate electrode 155 without substantially removing portions of the source contact 124, drain contact 126, or the a-IGZO fin 140. The removal of the dummy gate electrode 155 forms an opening 106 between the source contact 124 and the drain contact 126. According to an embodiment, the opening exposes a portion of the fin 140 that will function as the channel region of the transistor.

Referring now to FIGS. 5A-5D, a plan view illustration and corresponding cross-sectional illustrations along lines B-B', C-C', and D-D' show the device according to an embodiment of the invention after a gate dielectric layer 142, a gate workfunction layer 132 and a gate electrode 128 are formed. In an embodiment, the gate dielectric layer 142 may contact more than one surface of the a-IGZO fin 140. For example, the cross-sectional view along the width of the fin illustrates that the gate dielectric layer 142 contacts sidewall surfaces 171/172 of the a-IGZO fin 140 and a top surface 173 of the a-IGZO fin 140. According to an embodiment, the gate dielectric layer 142 may include one layer or a stack of layers. The one or more layers may include silicon oxide, $SiO_2$ and/or a high-k dielectric material. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 142 to improve its quality when a high-k material is used. It is noted that the thickness of the portion of the gate dielectric layer 142 formed along the sidewalls of the source contact 124 and the drain contact 126 may function as a spacer that allows for the optional omission of sidewall spacers on the dummy gate electrode 155 described above.

In an embodiment, the gate workfunction layer 132 and the gate electrode 128 may be any suitable conductive material. For example, the gate workfunction layer 132 may be the work-function metal. The conductive material used to form the gate electrode 128 may consist of at least one P-type workfunction metal or N-type workfunction metal, depending on whether the transistor is to be a PMOS or an NMOS transistor. In some embodiments, the gate electrode 128 may consist of a stack of two or more metal layers, where one or more metal layers are workfunction metal layers and at least one metal layer is a fill metal layer. Embodiments of the invention include a low temperature deposition process. For example, the conductive material may be deposited with a PVD process, such as sputtering, a CVD process, an ALD process, or any combination of processes. For example, the workfunction layer 132 may be a relatively thin layer deposited with an ALD process, and the fill metal of the gate electrode may be deposited with a faster deposition process, such as PVD. As shown in FIG. 5B, the gate electrode 128 may consist of a "U"-shaped structure that includes a bottom portion substantially parallel to the surface of the substrate 105 and two sidewall portions that are substantially perpendicular to the top surface of the substrate 105. Accordingly, embodiments of the invention include a gate electrode 128 that controls the channel nanowires 152 along more than one surface.

For a PMOS transistor, metals that may be used for the gate electrode 128 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode 128 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

Referring now to FIGS. 6A-6D, a plan view illustration and corresponding cross-sectional illustrations along lines B-B', C-C', and D-D' show the device according to an embodiment of the invention after the gate electrode 128, the gate workfunction layer 132, and the gate dielectric layer 142 are recessed. Removing the excess conductive material 128 and 132 from over the surface of the source contact 124 and the drain contact 126 electrically isolates the gate electrode 128 and the gate workfunction layer 132. Furthermore, it is to be appreciated that the processing operations used allow for the formation of a self-aligned gate electrode 128. Accordingly, no patterning processes are needed to form a gate electrode that is aligned above the channel. Additionally, the portions of the gate dielectric 142 formed over the top surfaces of the source contact 124 and the drain contact 126 may be removed. According to an embodiment, the excess material from the gate workfunction layer 132, the gate electrode 128, and the gate dielectric layer 142, may be removed with any suitable recessing process. For example, the recessing process may include one or more etching processes and/or a CMP process.

After the planarization process is completed, embodiments of the invention may continue with the formation of another dielectric layer. For example, when the transistor is formed in the BEOL stack, the next interconnect layer may be formed directly over a top surface of the transistor. Furthermore, since a-IGZO does not require a crystalline substrate in order to be deposited, the next layer of the BEOL stack may include an additional a-IGZO based transistor formed directly above the transistor illustrated in FIG. 6A.

Figure 10:
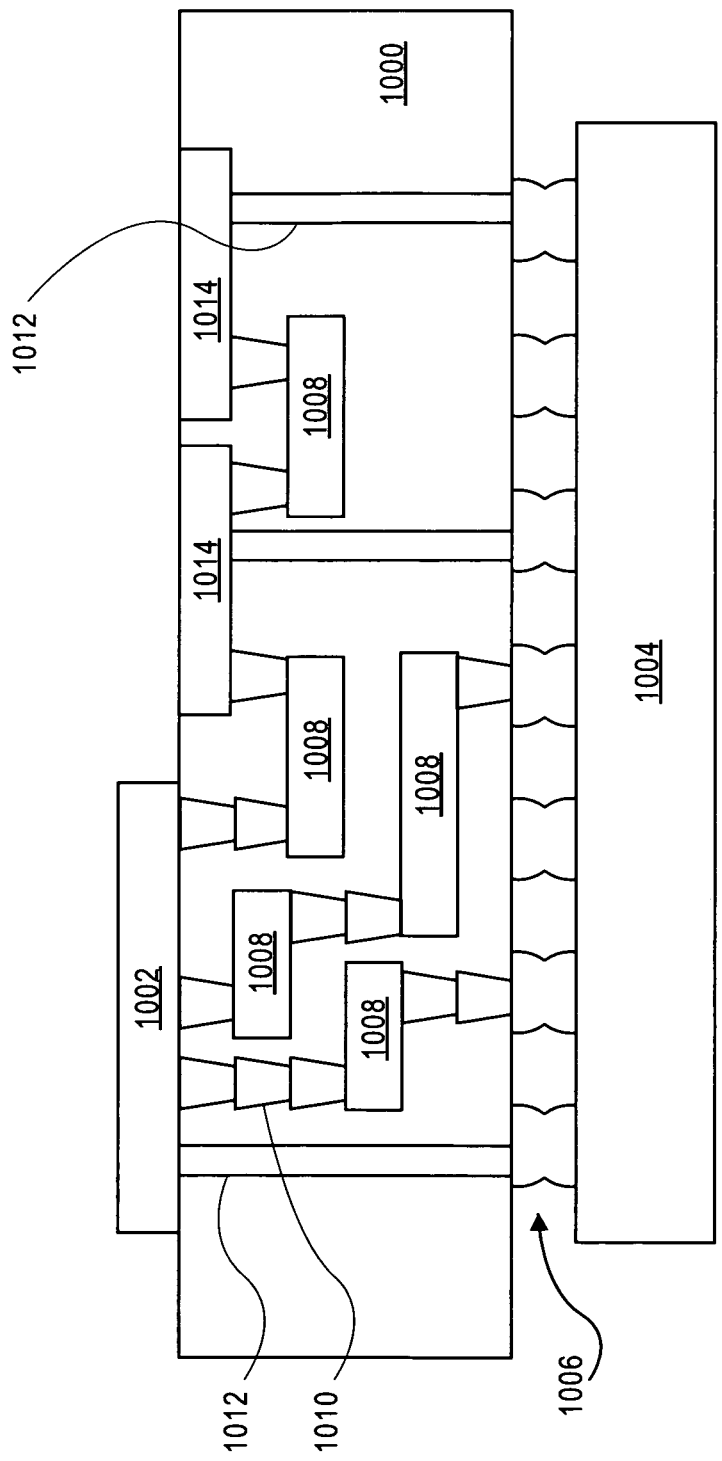
FIG. 10 is a cross-sectional illustration of an interposer implementing one or more embodiments of the invention.

FIG. 10 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1104 are attached to opposing sides of the interposer 1000. In other embodiments, the first and second substrates 1002/1104 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the invention, apparatuses that include non-planar a-IGZO transistors with wrap-around source and drain contacts, or processes for forming such devices disclosed herein may be used in the fabrication of interposer 1100.

Figure 11:
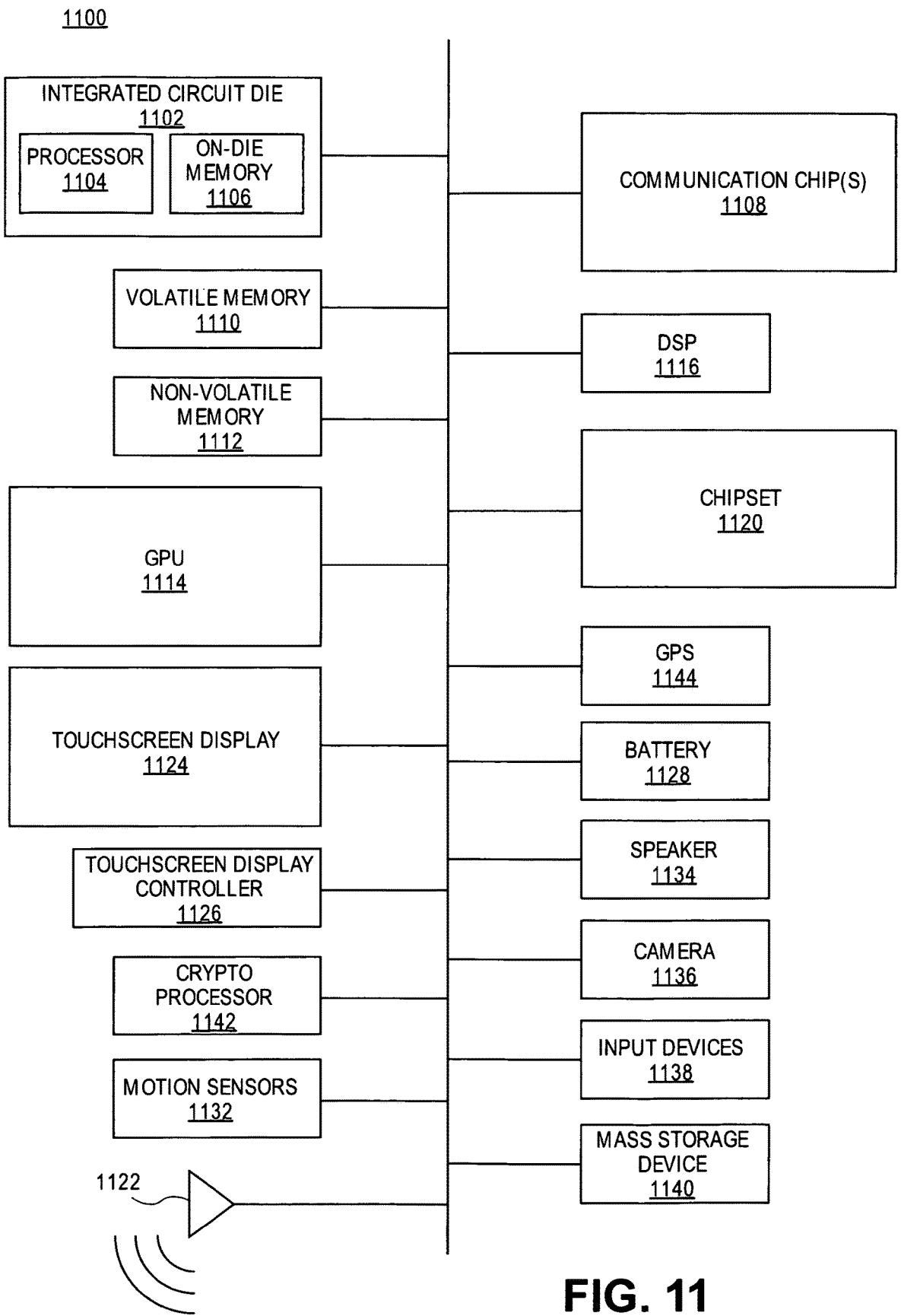
FIG. 11 is a schematic of a computing device that includes one or more transistors built in accordance with an embodiment of the invention.

FIG. 11 illustrates a computing device 1100 in accordance with one embodiment of the invention. The computing device 1100 may include a number of components. In one embodiment, these components are attached to one or more motherboards. In an alternate embodiment, these components are fabricated onto a single system-on-a-chip (SoC) die rather than a motherboard. The components in the computing device 1100 include, but are not limited to, an integrated circuit die 1102 and at least one communication chip 1108. In some implementations the communication chip 1108 is fabricated as part of the integrated circuit die 1102. The integrated circuit die 1102 may include a CPU 1104 as well as on-die memory 1106, often used as cache memory, that can be provided by technologies such as embedded DRAM (eDRAM) or spin-transfer torque memory (STTM or STTM-RAM).

Computing device 1100 may include other components that may or may not be physically and electrically coupled to the motherboard or fabricated within an SoC die. These other components include, but are not limited to, volatile memory 1110 (e.g., DRAM), non-volatile memory 1112 (e.g., ROM or flash memory), a graphics processing unit 1114 (GPU), a digital signal processor 1116, a crypto processor 1142 (a specialized processor that executes cryptographic algorithms within hardware), a chipset 1120, an antenna 1122, a display or a touchscreen display 1124, a touchscreen controller 1126, a battery 1128 or other power source, a power amplifier (not shown), a global positioning system (GPS) device 1144, a compass 1130, a motion coprocessor or sensors 1132 (that may include an accelerometer, a gyroscope, and a compass), a speaker 1134, a camera 1136, user input devices 1138 (such as a keyboard, mouse, stylus, and touchpad), and a mass storage device 1140 (such as hard disk drive, compact disk (CD), digital versatile disk (DVD), and so forth).

The communications chip 1108 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1108 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1108. For instance, a first communication chip 1108 may be dedicated to shorter range wireless communications such as Wi-Fi and Bluetooth and a second communication chip 1108 may be dedicated to longer range wireless communications such as GPS, EDGE, GPRS, CDMA, WiMAX, LTE, Ev-DO, and others.

The processor 1104 of the computing device 1100 includes one or more devices, such as non-planar a-IGZO transistors with wrap-around source and drain contacts, according to an embodiment of the invention. The term "processor" may refer to any device or portion of a device that processes electronic data from registers and/or memory to transform that electronic data into other electronic data that may be stored in registers and/or memory.

The communication chip 1108 may also include one or more devices, such as one or more non-planar a-IGZO transistors with wrap-around source and drain contacts, according to an embodiment of the invention.

In further embodiments, another component housed within the computing device 1100 may contain one or more devices, such as non-planar a-IGZO transistors with wrap-around source and drain contacts, or processes for forming such devices, according to an embodiment of the invention.

In various embodiments, the computing device 1100 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a semiconductor device, comprising: a substrate; an InGaZnO (IGZO) fin formed above the substrate a source contact formed adjacent to more than one surface of the IGZO fin; a drain contact formed adjacent to more than one surface of the IGZO fin; and a gate electrode formed between the source contact and the drain contact, wherein the gate electrode is separated from the IGZO layer by a gate dielectric.

Additional embodiments of the invention include a semiconductor device, wherein source contact and the drain contact are adjacent to sidewall surfaces of the IGZO fin and a top surface of the IGZO fin.

Additional embodiments of the invention include a semiconductor device, wherein the source contact and the drain contact directly contact the IGZO fin.

Additional embodiments of the invention include a semiconductor device, further comprising: an interface layer positioned between the IGZO fin and the source and drain contacts.

Additional embodiments of the invention include a semiconductor device, wherein the IGZO fin includes one or more alternating layers of an IGZO material and a sacrificial material.

Additional embodiments of the invention include a semiconductor device, wherein the source and drain contacts are separated from the gate electrode by at least the gate dielectric.

Additional embodiments of the invention include a semiconductor device, wherein the source and drain contacts are separated from the gate electrode by at least the gate dielectric and a spacer.

Additional embodiments of the invention include a semiconductor device, wherein the source and drain contacts comprise a conductive oxide.

Additional embodiments of the invention include a semiconductor device, wherein the conductive oxide is indium-tin-oxide (ITO) or indium-zinc-oxide (IZO).

Additional embodiments of the invention include a semiconductor device, wherein the source and drain contacts comprise a semiconducting material.

Additional embodiments of the invention include a semiconductor device, wherein the substrate is a dielectric layer.

Additional embodiments of the invention include a semiconductor device, wherein the dielectric layer is a layer in a back end of line (BEOL) stack of an integrated circuit chip.

Embodiments of the invention include a method of forming a non-planar InGaZnO (IGZO) transistor, comprising: forming a first layer over a substrate, wherein the first layer includes IGZO; patterning the first layer to form a fin; forming a dummy gate electrode over the fin; forming a source contact and a drain contact on opposite sides of the dummy gate electrode, wherein the source and drain contact are adjacent to more than one surface of the fin; removing the dummy gate electrode; forming a gate dielectric layer on exposed portions of the IGZO; and forming a gate electrode over the gate dielectric layer.

Additional embodiments of the invention include a method of forming a non-planar IGZO transistor, wherein forming the source and drain region comprises: forming a dielectric layer over the fin; patterning the dielectric layer to form contact openings, wherein the contact openings have a width that is greater than a width of the fin; and depositing a conductive material into the contact openings.

Additional embodiments of the invention include a method of forming a non-planar IGZO transistor, further comprising: depositing a conductive interface layer into the contact openings prior to depositing the conductive material, wherein the conductive interface layer conforms to the surfaces of the fin.

Additional embodiments of the invention include a method of forming a non-planar IGZO transistor, wherein the conductive interface layer is deposited with an atomic layer deposition process.

Additional embodiments of the invention include a method of forming a non-planar IGZO transistor, wherein the source and drain contacts comprise a conductive oxide.

Additional embodiments of the invention include a method of forming a non-planar IGZO transistor, wherein the conductive oxide is indium-tin-oxide (ITO) or indium-zinc-oxide (IZO).

Additional embodiments of the invention include a method of forming a non-planar IGZO transistor, wherein the source and drain contacts comprise a semiconducting material.

Additional embodiments of the invention include a method of forming a non-planar IGZO transistor, wherein the first layer includes a plurality of sacrificial material layers in an alternating pattern with a plurality of IGZO layers.

Embodiments of the invention include a semiconductor device, comprising: a substrate; a source contact formed over the substrate; a drain contact formed over the substrate; a gate electrode formed between the source contact and the drain contact, wherein the gate electrode is separated from drain contact and the source contact by at least a spacer layer; an InGaZnO (IGZO) nanowire formed through the gate electrode and contacting the source contact and the drain contact.

Additional embodiments of the invention include a semiconductor device, wherein the IGZO nanowire passes through an opening in a residual spacer formed below the spacer.

Additional embodiments of the invention include a semiconductor device, wherein the residual spacer has a width that is less than a width of the spacer.

Additional embodiments of the invention include a semiconductor device, wherein the source contact and the drain contact completely encircle the surfaces of the IGZO nanowire.

What is claimed is:

1. A semiconductor device, comprising:
a substrate;
an InGaZnO (IGZO) fin formed above the substrate;
a single source contact formed adjacent to more than one surface of the IGZO fin, wherein the source contact is adjacent to a first sidewall surface of the IGZO fin, a second sidewall surface of the IGZO fin, and a top surface of the IGZO fin, wherein a single material layer of the single source contact directly contacts the first sidewall surface of the IGZO fin, the second sidewall surface of the IGZO fin, and the top surface of the IGZO fin, wherein the first sidewall surface of the IGZO fin and the second sidewall surface of the IGZO fin have a height, and wherein the single source contact is in contact with a portion of but not an entirety of the height of the first sidewall surface and the second sidewall surface of the IGZO fin;
a single drain contact formed adjacent to more than one surface of the IGZO fin, wherein the drain contact is adjacent to the first sidewall surface of the IGZO fin, the second sidewall surface of the IGZO fin, and a top surface of the IGZO fin, wherein a single material layer of the single drain contact directly contacts the first sidewall surface of the IGZO fin, the second sidewall surface of the IGZO fin, and the top surface of the IGZO fin, and wherein the single drain contact is in contact with a portion of but not an entirety of the height of the first sidewall surface and the second sidewall surface of the IGZO fin; and
a gate electrode formed between the source contact and the drain contact, wherein the gate electrode is separated from the IGZO layer by a gate dielectric.

2. The semiconductor device of claim 1, wherein the source and drain contacts are separated from the gate electrode by at least the gate dielectric.

3. The semiconductor device of claim 2, wherein the source and drain contacts are separated from the gate electrode by at least the gate dielectric and a spacer.

4. The semiconductor device of claim 1, wherein the source and drain contacts comprise a conductive oxide.

5. The semiconductor device of claim 4, wherein the conductive oxide is indium-tin-oxide (ITO) or indium-zinc-oxide (IZO).

6. The semiconductor device of claim 1, wherein the substrate is a dielectric layer.

7. The semiconductor device of claim 6, wherein the dielectric layer is a layer in a back end of line (BEOL) stack of an integrated circuit chip.

8. The semiconductor device of claim 1, wherein the source contact and the drain contact directly contact the IGZO fin.

9. The semiconductor device of claim 1, wherein the IGZO fin includes one or more alternating layers of an IGZO material and a sacrificial material.

10. The semiconductor device of claim 1, wherein the source and drain contacts comprise a semiconducting material.

11. A semiconductor device, comprising:
a substrate;
an InGaZnO (IGZO) fin formed above the substrate;
a source contact formed adjacent to more than one surface of the IGZO fin;
a drain contact formed adjacent to more than one surface of the IGZO fin;

a gate electrode formed between the source contact and the drain contact, wherein the gate electrode is separated from the IGZO fin by a gate dielectric; and an interface layer positioned between the IGZO fin and the source and drain contacts, wherein the interface layer is in direct contact with a top surface of the IGZO fin, a first sidewall surface of the IGZO fin, and a second sidewall surface of the IGZO fin.

12. A method of forming a non-planar InGaZnO (IGZO) transistor, comprising:

forming a first layer over a substrate, wherein the first layer includes IGZO;

patterning the first layer to form a fin;

forming a dummy gate electrode over the fin;

forming a single source contact and a single drain contact on opposite sides of the dummy gate electrode, wherein the source and drain contact are adjacent to more than one surface of the fin, wherein the source contact and the drain contact are adjacent to a first sidewall surface of the IGZO fin, a second sidewall surface of the IGZO fin, and a top surface of the IGZO fin, and wherein a single material layer of the single source contact and a single material layer of the single drain contact directly contact the first sidewall surface of the IGZO fin, the second sidewall surface of the IGZO fin, and the top surface of the IGZO fin, wherein the first sidewall surface of the IGZO fin and the second sidewall surface of the IGZO fin have a height, and wherein the single source contact and the single drain contact are in contact with a portion of but not an entirety of the height of the first sidewall surface and the second sidewall surface of the IGZO fin;

removing the dummy gate electrode;

forming a gate dielectric layer on exposed portions of the IGZO; and forming a gate electrode over the gate dielectric layer.

13. The method of claim 12, wherein the source and drain contacts comprise a conductive oxide.

14. The method of claim 13, wherein the conductive oxide is indium-tin-oxide (ITO) or indium-zinc-oxide (IZO).

15. The method of claim 12, wherein the first layer includes a plurality of sacrificial material layers in an alternating pattern with a plurality of IGZO layers.

16. The method of claim 15, further comprising:

removing a portion of the sacrificial material layers that is formed between the source region and the drain region prior to forming the gate dielectric layer.

17. The method of claim 12, wherein forming the source and drain region comprises:

forming a dielectric layer over the fin;

patterning the dielectric layer to form contact openings, wherein the contact openings have a width that is greater than a width of the fin; and depositing a conductive material into the contact openings.

18. The method of claim 12, wherein the source and drain contacts comprise a semiconducting material.

* * * * *